(12) United States Patent
Zhang et al.

(10) Patent No.: US 10,869,418 B2
(45) Date of Patent: Dec. 15, 2020

(54) LAMP

(71) Applicant: GE Lighting Solutions, LLC, East Cleveland, OH (US)

(72) Inventors: Wenjiang Zhang, Shanghai (CN); Weihu Chen, Shanghai (CN); Wanhua Han, Xian (CN)

(73) Assignee: Consumer Lighting (U.S.), LLC, Norwalk, CT (US)

( * ) Notice: Subject to any disclaimer, the term of this patent is extended or adjusted under 35 U.S.C. 154(b) by 0 days.

(21) Appl. No.: 16/181,764

(22) Filed: Nov. 6, 2018

(65) Prior Publication Data
US 2019/0166732 A1    May 30, 2019

(30) Foreign Application Priority Data

Nov. 24, 2017   (CN) .......................... 2017 1 1190699

(51) Int. Cl.
| | | |
|---|---|---|
| *F21V 23/06* | (2006.01) | |
| *H05K 9/00* | (2006.01) | |
| *F21K 9/238* | (2016.01) | |
| *F21V 23/00* | (2015.01) | |
| *F21V 29/70* | (2015.01) | |
| *F21K 9/233* | (2016.01) | |

(Continued)

(52) U.S. Cl.
CPC ........... *H05K 9/0084* (2013.01); *F21K 9/233* (2016.08); *F21K 9/238* (2016.08); *F21V 23/003* (2013.01); *F21V 23/006* (2013.01); *F21V 23/06* (2013.01); *F21V 29/70* (2015.01); *F21V 5/007* (2013.01); *F21Y 2115/10* (2016.08)

(58) Field of Classification Search
None
See application file for complete search history.

(56) References Cited

U.S. PATENT DOCUMENTS

| | | |
|---|---|---|
| 5,446,617 A | 8/1995 | Blocher et al. |
| 8,434,891 B1 | 5/2013 | Ham |

(Continued)

FOREIGN PATENT DOCUMENTS

| | | |
|---|---|---|
| CN | 201326956 Y | 10/2009 |
| CN | 203099560 U | 7/2013 |

(Continued)

OTHER PUBLICATIONS

First Chinese Office Action received for Chinese Patent Application 201711190699.2 dated Aug. 4, 2020, 14 pages, (8 pages Official Copy + 6 Pages English Translation).

*Primary Examiner* — Elmito Breval
(74) *Attorney, Agent, or Firm* — Wood IP LLC

(57) ABSTRACT

The present invention provides a lamp, comprising a lamp shell, which comprises a base configured to connect an external power supply and a heat dissipation module coupled to the base, wherein an interior chamber is defined within the lamp shell; a light source; and a driver module coupled to the light source, with at least part of the driver module located within the interior chamber, the driver module is configured to regulate current provided to the light source. The lamp shell comprises a mounting module configured to receive a mounting part of the driver module to fasten the driver module to the lamp shell, the driver module and the heat dissipation module of the lamp shell are electrically connected.

11 Claims, 6 Drawing Sheets

(51) Int. Cl.
*F21Y 115/10* (2016.01)
*F21V 5/00* (2018.01)

(56) References Cited

U.S. PATENT DOCUMENTS

| | | | |
|---|---|---|---|
| 8,721,359 B1 | 5/2014 | Tate | |
| 9,137,860 B2 | 9/2015 | Fujita et al. | |
| 9,212,801 B2* | 12/2015 | Leung | F21K 9/23 |
| 9,245,874 B2 | 1/2016 | Demuynck | |
| 9,279,574 B2* | 3/2016 | Preuschl | F21V 27/02 |
| 9,516,720 B2 | 12/2016 | Malyna et al. | |
| 9,970,646 B2* | 5/2018 | Brnada | F21V 29/70 |
| 2010/0238672 A1* | 9/2010 | Wu | F21K 9/65 |
| | | | 362/373 |
| 2010/0264821 A1* | 10/2010 | Lutz | F21K 9/233 |
| | | | 315/32 |
| 2011/0075423 A1* | 3/2011 | Van De Ven | F21V 17/162 |
| | | | 362/249.02 |
| 2012/0025706 A1* | 2/2012 | Wang | F21V 17/14 |
| | | | 315/35 |
| 2012/0268941 A1* | 10/2012 | Shih | F21V 3/02 |
| | | | 362/294 |
| 2013/0020941 A1* | 1/2013 | Breidenassel | F21V 23/005 |
| | | | 315/113 |
| 2013/0257278 A1* | 10/2013 | DeVore | H01J 5/54 |
| | | | 315/113 |
| 2013/0279175 A1* | 10/2013 | Hussell | F21V 19/004 |
| | | | 362/310 |
| 2014/0104858 A1* | 4/2014 | Holland | F21V 19/001 |
| | | | 362/369 |
| 2014/0307441 A1* | 10/2014 | Wu | F21V 31/005 |
| | | | 362/267 |
| 2015/0015152 A1 | 1/2015 | Aboulnaga et al. | |
| 2015/0362168 A1* | 12/2015 | Power | F21K 9/23 |
| | | | 362/294 |
| 2017/0074502 A1* | 3/2017 | Brnada | F21V 29/70 |
| 2017/0146199 A1* | 5/2017 | Weng | F21K 9/233 |

FOREIGN PATENT DOCUMENTS

| | | |
|---|---|---|
| CN | 203784682 U | 8/2014 |
| CN | 204786263 U | 11/2015 |
| CN | 205332138 U | 6/2016 |
| CN | 106439559 A | 2/2017 |

* cited by examiner

US 10,869,418 B2

LAMP

TECHNICAL FIELD

The present application is applicable to the field of illumination, and in particular to a lamp for lighting having emi shielding function of a driver module.

BACKGROUND

Compared to ordinary light sources, LED light sources are highly efficient, environmentally friendly and have a long service life, therefore they are becoming the primary choice for reducing indoor and external lighting energy consumption.

Lamps based on LED light sources often comprise electronics integrated with LED driver circuitry to regulate the current supplied to the power supply, which may have electromagnetic interference (EMI). EMI can negatively impact the operation of other electronic devices.

In previous attempts, EMI control could be achieved through driver's printed circuit board anti-interference design or by adding EMI suppression units, such as EMI filters. By making changes to the printed circuit board design, it increases design cost and board complexity. However, adding an EMI suppression unit may result in the drive being too bulky, which makes it not suitable for some smaller lamps, since it cannot be placed inside the fixture.

Therefore, it is necessary to provide a shielding method for electromagnetic interference for a lamp and/or a lamp driver module with electromagnetic interference shielding performance, in order to solve the technical problem above.

SUMMARY

The present application provides a lamp, comprising a lamp shell, which comprises a base configured to connect an external power supply and a heat dissipation module coupled to the base, wherein an interior chamber is defined within the lamp shell; a light source; and a driver module coupled to the light source, with at least part of the driver module located within the interior chamber, the driver module is configured to regulate current provided to the light source. The lamp shell comprises a mounting module configured to receive a mounting part of the driver module to fasten the driver module to the lamp shell, the driver module and the heat dissipation module of the lamp shell are electrically connected.

The purpose of the present application is to provide a lamp for illumination with driver EMI shielding function, whereby the shielding performance of the EMI radiation of the lamp can be improved by only adjusting the mating relationship between the driver and the lamp heat dissipation module.

BRIEF DESCRIPTION OF DRAWINGS

Embodiments of the present application are described with reference to the accompanying drawings, so that the present invention can be better understood. In the accompanying drawings.

DETAILED DESCRIPTION OF EMBODIMENTS

Unless otherwise defined, technical terms or scientific terms used herein shall be used in the ordinary meaning as understood by those having ordinary skill in the art to which the invention pertains. The "first", "second" and similar words used in the patent specification and claims of the present invention do not denote any order, quantity or importance, but are merely intended to distinguish between different constituents. Similarly, the terms "one", "a", and similar words are not meant to be limiting, but rather denote the presence of at least one. "Comprising", "consisting", and similar words mean that elements or articles appearing before "comprising" or "consisting" include the elements or articles and their equivalent elements appearing behind "comprising" or "consisting", not excluding any other elements or articles. "Connected", "coupled" and similar words are not restricted to physical or mechanical connections, but may also include electrical connections, whether direct or indirect.

The present application can be applied to a variety of lamps for illumination having electromagnetic interference (EMI) shielding requirements including, but not limited to, light emitting diode (LED) lamps, organic light emitting diode (OLED) lamps, fluorescent lamps, and high intensity discharge (HID) lamps. The LED lamp will be described in detail below as an example.

Figure 1:
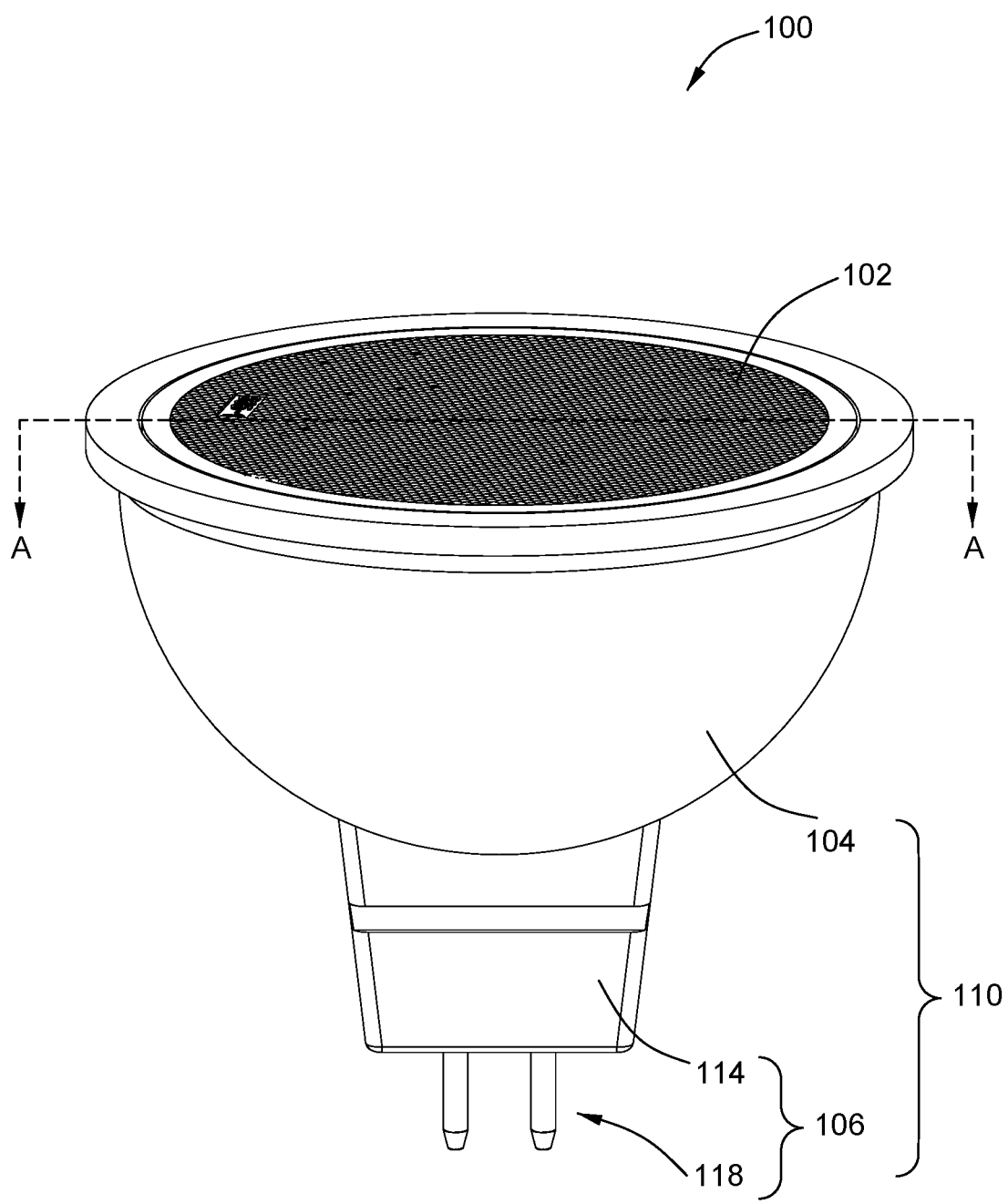
FIG. 1 is a perspective view of an LED lamp in accordance with an embodiment of the present invention.
Figure 2:
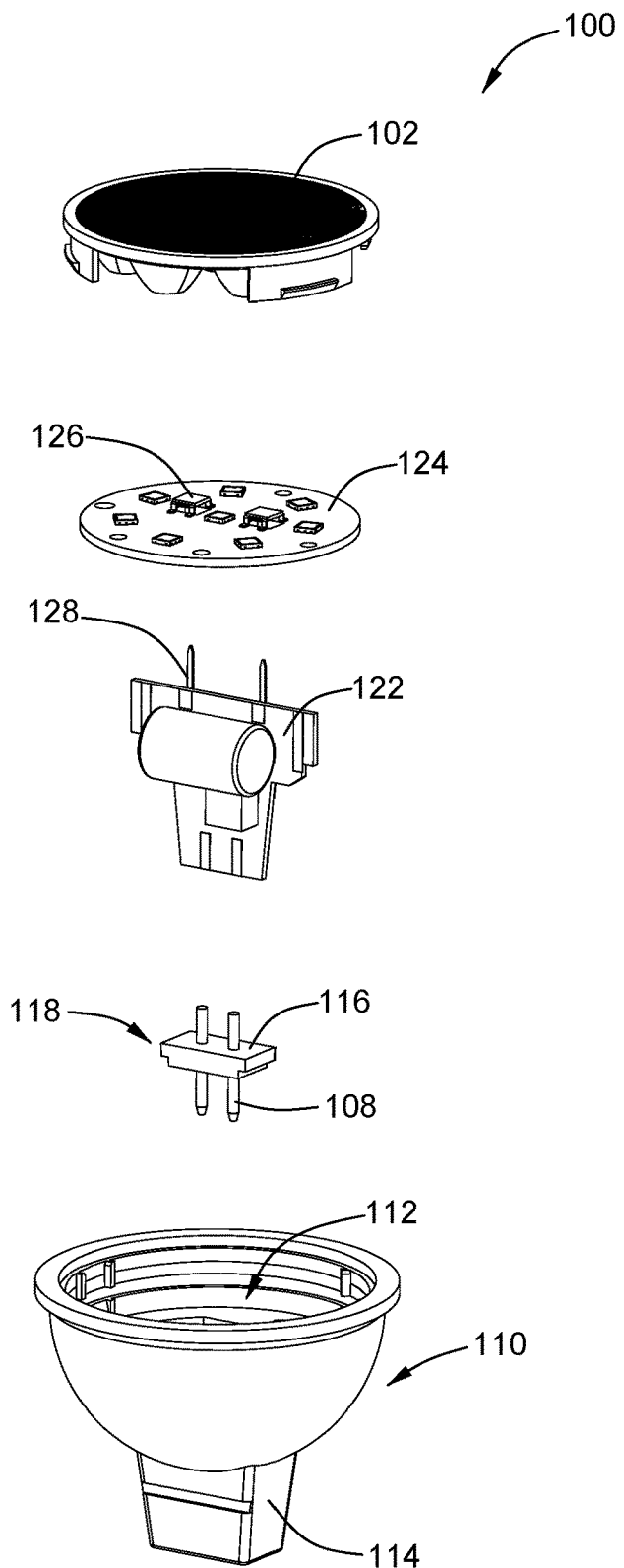
FIG. 2 is an exploded view of the LED lamp shown in FIG. 1.
Figure 3:
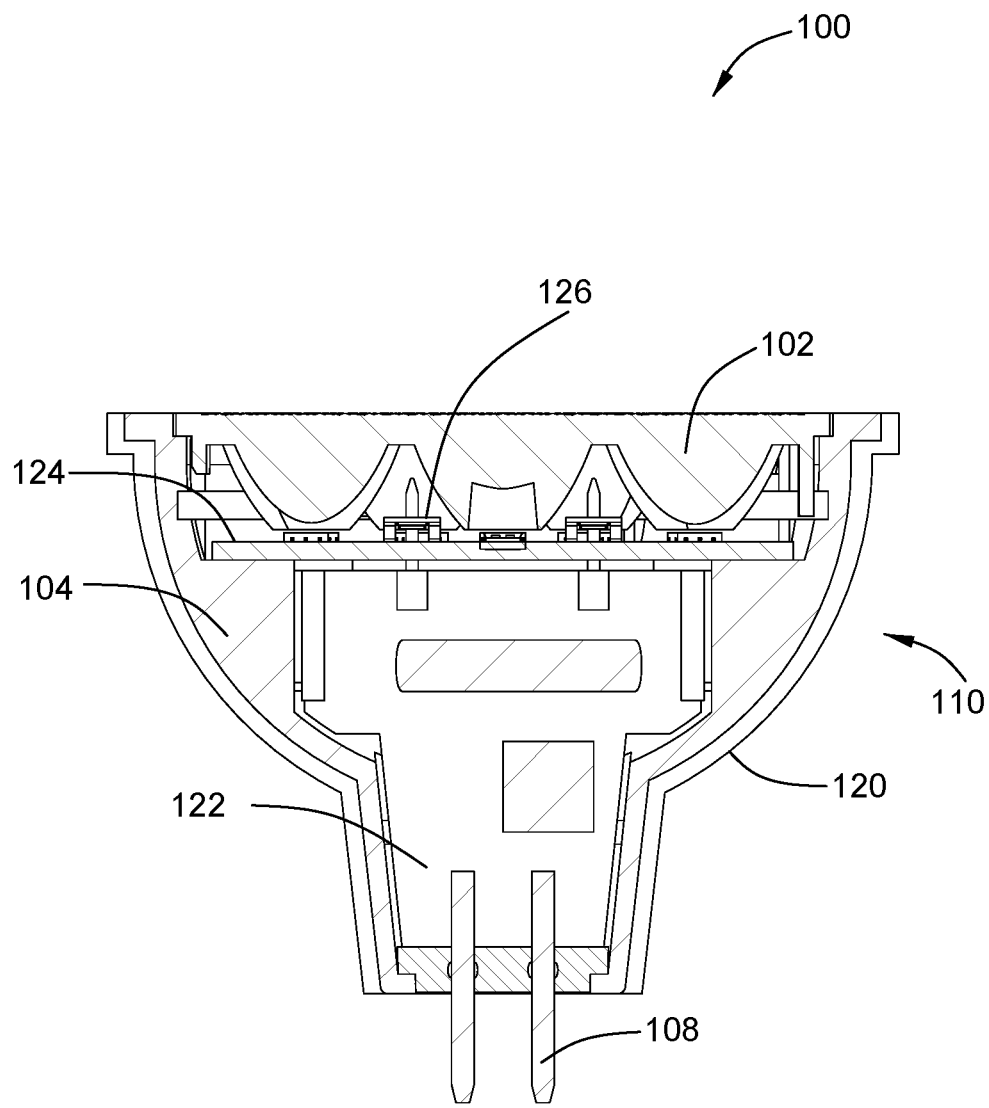
FIG. 3 is a cross-sectional view of the LED lamp of FIG. 1 taken along line A-A.

FIG. 1 is a perspective view of an LED lamp in accordance with an embodiment of the present invention. FIG. 2 is an exploded diagram of the LED lamp 100 shown in FIG. 1. FIG. 3 is a sectional diagram of the LED lamp 100 shown in FIG. 1 along a line A-A.

As shown in FIGS. 1, 2 and 3, the LED lamp 100 comprises a lamp shell 110 and a lens 102 coupled to the lamp shell 110, where in the interior chamber 112 is defined between the lamp shell 110 and the lens 102. The lamp shell 110 comprises a base 106 configured to connect an external power supply and a heat dissipation module 104 coupled to the base 106. In some embodiments, the lens 102 can be replaced with a transparent flat glass or flat sheet of resin. In some embodiments, the LED lamp 100 may not include a lens.

As shown in FIGS. 1 and 2, the base 106 is illustrated as a plug-in base that includes a cover structure 114 and a pin module 118 mounted within the cover structure 114 that is close to the bottom end of the cover structure 114 (only partially visible in FIG. 1, the overall structure is shown in FIG. 2). The pin module 118 comprises an insulating support plate 116 and a pin 108 extending from the bottom end of the cover structure 114 and is configured to connect to an external power supply, the other end of the cover structure 114 is coupled to the tapered or hemispherical heat dissipation module 104. The material of the heat dissipation module 104 is selected from materials that are thermally conductive and provide EMI shielding, wherein one example of such a material having these characteristics is a metal including, but not limited to, aluminum and alloys. In some embodiments, the cover structure 114 of the base 106 and the heat dissipation module 104 are integrally formed. In some embodiments, the cover structure 114 and the heat dissipation module 104 are respectively formed and coupled together, wherein the metal material selected for the cover structure 114 may be the same as the heat dissipation module 104. In some embodiments, the material selected for the cover structure 114 may also be an insulating material, such as the same material as the insulating support plate 116, alternatively, the cover structure 114 may be integrally formed with the insulating support plate 116.

As shown in FIG. 3, in some embodiments, the lamp shell 110 further comprises an insulating shell 120 covering an outer surface of the heat dissipation module 104 and the base 106, the insulating shell 120 made of a material selected from polyvinyl chloride (PVC) alloy, polycarbonate (PC), polymethyl methacrylate (PMMA, acrylic), polyvinyl chloride (PVC), polystyrene (PS), polyethylene (PE) and combinations thereof. In some embodiments, the insulating shell 120 may only cover a part of the outer surface of the heat dissipation module 104 and/or the base 106. In some embodiments, the insulating shell 120 may cover a part of the outer surface of the heat dissipation module 104 and/or the base 106 through coating, or it may be mounted to a part of the outer surface of the heat dissipation module 104 and/or base 106 after processing.

In other embodiments, the LED lamp 100 may comprise other types of bases, such as a threaded mount or a bayonet mount. The threaded mount comprises an insulating portion and a threaded portion extending outward from at least a part of an outer surface of the insulating portion, the threaded portion is configured to connect with the external power supply, the insulating portion is coupled to the heat dissipation module (104). Similarly, the outer surface of at least a portion of the heat dissipation module may be covered with an insulating shell.

As shown in FIG. 2, the LED lamp 100 further comprises a driver module 122 and a light panel 124 located within the interior chamber 112 and coupled to the lamp shell 110, and a light source 126 mounted on the light panel 124. In some embodiments, the light source 126 may comprise one or more solid state light sources, including but not limited to light emitting diode (LED), organic light emitting diode (OLED), gas discharge source of fluorescent tubes, and/or high intensity discharge (HID) light source. The light panel 124 is mounted on the heat dissipation module 104 of the lamp shell 110, and the light panel 124 provides a pair of terminals for coupling a pair of pins 128 on the driver module 122, to achieve an electrical connection between the light source 126 and the driver module 122. Therefore, one end of the driver module 122 is coupled to the light source 126 through the pins 128, while the other end is coupled to the external power supply through the pins 108 for adjusting the current supplied to the light source 126. In some embodiments, the pins 128 may be replaced with a wire, one end of which is coupled to the driver module 122 while the other end is soldered to the light source 126 through one or more holes provided by the light panel 124, to achieve the electrical connection between the light source 126 and the driver module 122. In some embodiments, the driver module 122 of the LED lamp 100 comprises a high frequency switch, which provides high frequency switching during operation of the LED lamp 100, and EMI may be present.

In the embodiment shown in FIG. 3, the LED lamp 100 may be a reflector type LED lamp. The light source 126 is located within the area formed by the lens 102, the light panel 124, and the heat dissipation module 104. Whereby, the inner surface of the heat dissipation module 104 is reflective. In other embodiments, other structures having a reflective function may be added between the light panel 124 and the lens 102. In some embodiments, the light source 126 and/or light panel 126 are not located within the interior chamber 112. In some embodiments, at least a portion of the driver module 122 is located within the interior chamber 112.

Figure 4:
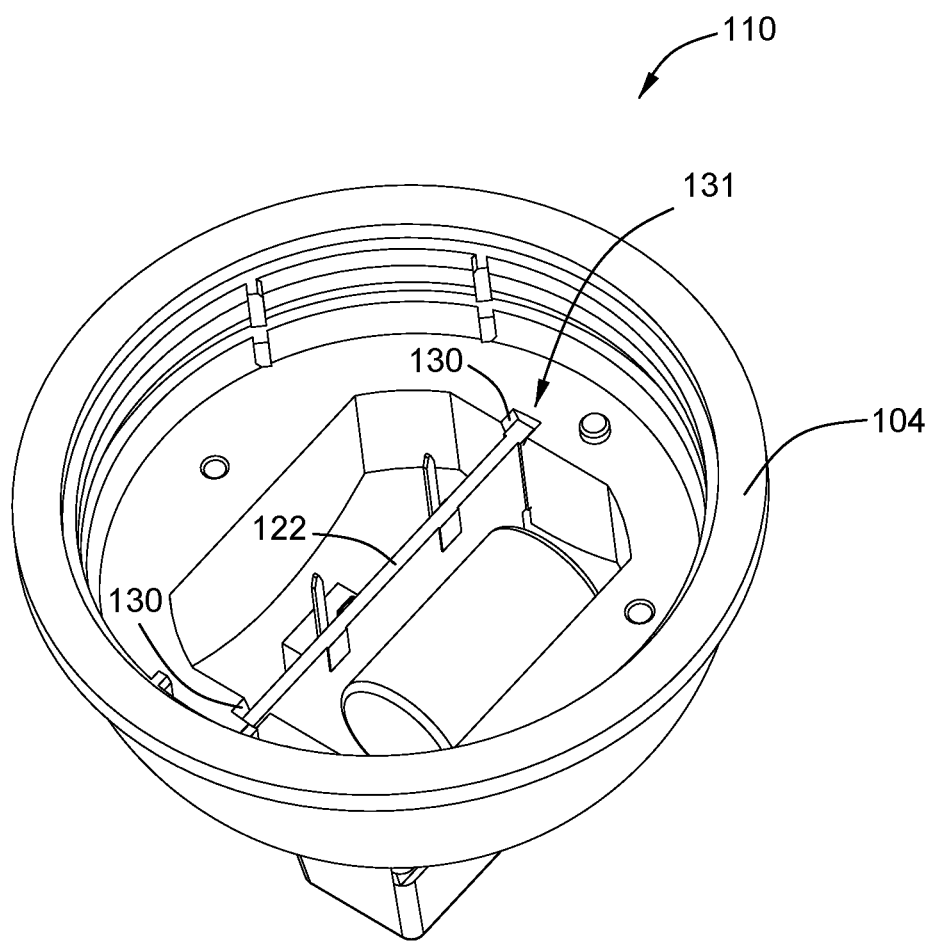
FIG. 4 shows the mating relationship of a lamp shell and a driver module suitable for the LED lamp shown in FIG. 1.

FIG. 4 shows a mating relationship of the lamp shell 110 and the driver module 122 suitable for the LED lamp 100 shown in FIG. 1. The heat dissipation module 104 of the lamp shell 110 comprises a mounting module 131 for receiving a mounted portion of the driver module 122 in order to fix the driver module 122 to the lamp shell 110. The mounting module 131 comprises a pair of mounting slots 130 that are symmetrical with respect to a central axis of the lamp 100. To improve the EMI radiation shielding performance of the LED lamp driver module 122, a reliable electrical connection between the driver module 122 and the heat dissipation module 104 is required. In some other embodiments, the mounting module 131 comprises a plurality of mounting slots configured for receiving the driver module 122.

In some embodiments, a reliable electrical connection between the driver module and the heat dissipation module is achieved by applying a solder paste to one end of the driver module, and fitting the solder paste coated end to the mounting slot. In some embodiments, the driver module comprises a leaf spring coupled to the heat dissipation module to achieve the electrical connection between the driver module and the heat dissipation module. The two embodiments will be described in detail below.

Figure 5:
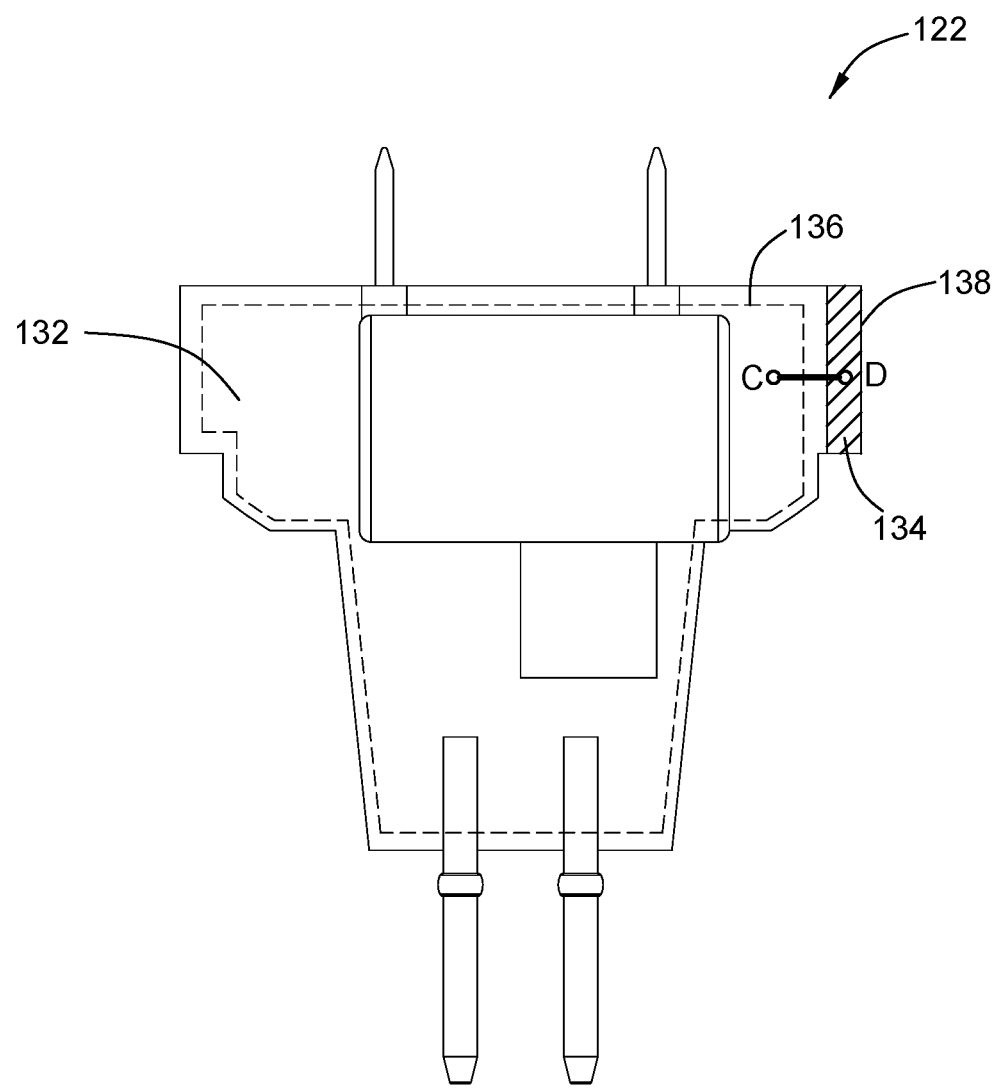
FIG. 5 is a front view of the driver module shown in FIG. 4.

FIG. 5 is a front view of the driver module 122. The driver module 122 comprises a circuit board 132, on which is formed a driver circuit (not shown) that controls the operation of the LED lamp, and the driver circuit may be selected from any conventional circuit known to those skilled in the art. In some embodiments, the circuit board 132 has a virtual boundary line 136 surrounding the driver circuit, and the width of the virtual boundary line 136 from the end surface 138 of the circuit board 132 is greater than the width of the electrode 134 formed after the solder paste is applied, ensuring that the necessary electrical clearance between the electrode 134 and the driver circuits meet safety requirements. The circuit board 132 has an electrical contact D, which may be a pad, which is formed in an area covered by the electrode 134. The driver circuit comprises a power supply ground terminal C, the power supply ground terminal C and the electrical contact D can be electrically connected through a copper mold wire or a bonding wire. In a specific embodiment, as shown in FIG. 4, first, solder paste is applied to one end of the driver module 122 to form an electrode 134, and the electrode 134 covers the electrical contact D. Then, one end of the driver module 122 coated with the solder paste is mounted in the mounting slot 130 to form a tight fit or an interference fit thereof, to achieve an electrical connection between the driver module 122 and the heat dissipation module 104, that is, to achieve an electrical connection between the power supply ground terminal C of the driver circuit and the heat dissipation module 104, thereby improving the radiation shielding performance of the LED lamp driver module 122. In one embodiment, the gap between the uncoated solder paste driver module 122 and the mounting slot 130 is 0.1 mm, the thickness of the electrode 134 ranges from about 0.15 to 0.25 mm, 0.2 mm, the width of the electrode 134 ranges from about 1 to 2 mm, 1.5 mm. In some embodiments, the solder paste is applied only to one side of the driver module 122, and in some embodiments, the solder paste can be coated on both sides of the driver module 122.

Figure 6:
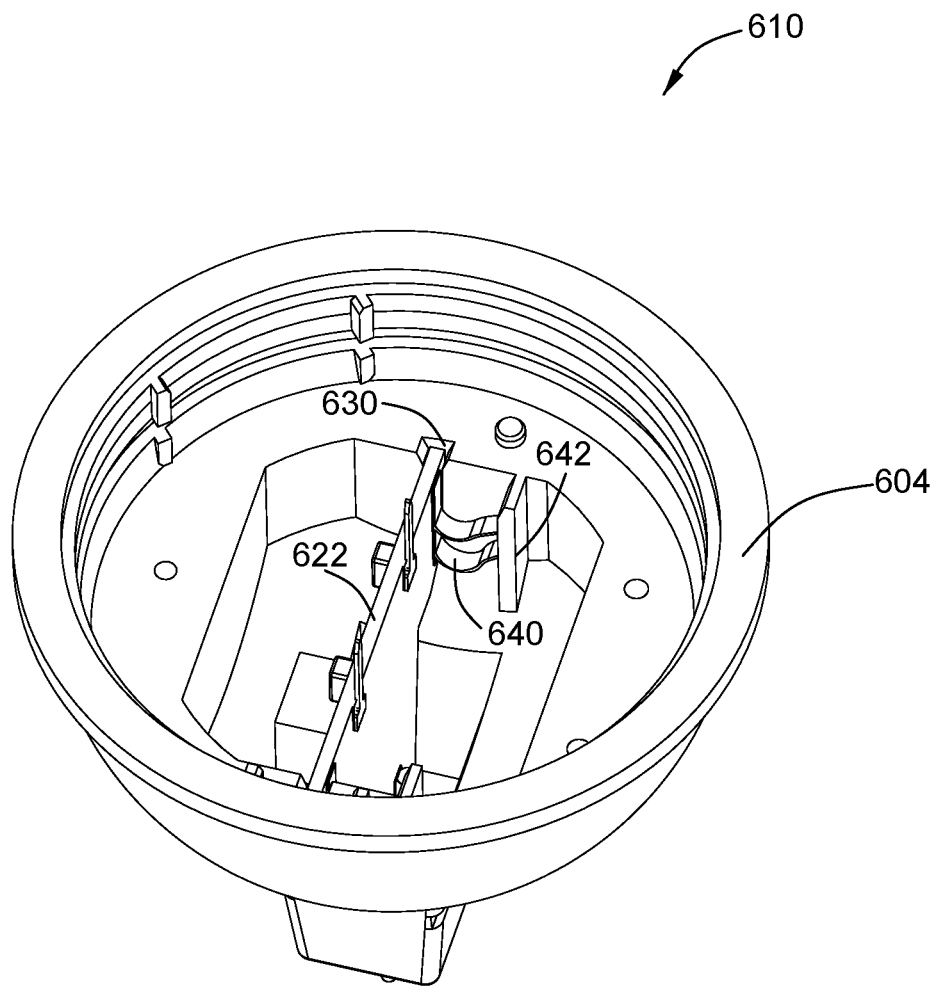
FIG. 6 shows another mating relationship of the lamp shell and the driver module suitable for the LED lamp shown in FIG. 1.

FIG. 6 shows another mating relationship of the lamp shell 610 and the driver module 622 suitable for the LED lamp shown in FIG. 1. In this embodiment, the driver module 622 comprises a power supply ground terminal C and an electrical contact D similar to those shown in FIG. 5. The driver module 622 comprises a leaf spring 640 that is soldered to the electrical contact D of the driver module 622, which has the necessary electrical clearance between the leaf spring 640 and the driver circuit, in some embodiments, the leaf spring can also be coupled to an electrical contact of the driver module 622 through other means. The heat dissipation module 604 of the lamp shell 610 comprises a boss 642 that extends from the heat dissipation module 604 to the interior chamber 612. In some embodiments, the boss 642 and the heat dissipation module 604 are integrally formed using the same material as the heat dissipation module 604. In a specific embodiment, the driver module 622 is mounted into the mounting slot 630, the leaf spring 640 is coupled to the boss 642 of the heat dissipation module 604, to achieve an electrical connection between the driver module 622 and the heat dissipation module 604, that is, to achieve an electrical connection between the power supply ground terminal C of the driver circuit and the heat dissipation module 604, thereby improving the radiation shielding performance of the LED lamp driver module 622. In one embodiment, the leaf spring 640 can be coupled to the heat dissipation module 604 by a route other than through the boss 642, such as directly to the inner surface of the heat dissipation module 604.

In some embodiments, the lamp shell comprises only the heat dissipation module and does not comprise the insulating shell 120 as shown in FIG. 3. Referring to FIG. 4 and FIG. 5, it is necessary to add a capacitor (not shown) between the power supply ground terminal C and the electrical contact D (i.e., the heat dissipation module 104) to achieve insulation performance of the grounding of the heat dissipation module 104 at a high voltage (about 850 V).

As can be seen from the above-mentioned embodiments, the present application can solve the EMI radiation problem of the lamp driver module by using only simple welding or mating with leaf springs, which fits with the structure of the heat dissipation module itself and is convenient to install, and does not require any additional wires or additional manual welding and/or tightening screws during the installation of the driver module onto the heat dissipation module, thereby saving cost and increasing work efficiency.

While the present invention has been described in connection with the specific embodiments, it will be understood by those skilled in the art that many modifications and variations can be made in the present application. It is, therefore, to be understood that the appended claims are intended to cover all such modifications and variations insofar as they are within the concept and scope of the invention.

The invention claimed is:

1. A lamp, comprising:
   a lamp shell comprising an interior chamber defined within the lamp shell, a heat dissipation module defined by an outer surface of the lamp shell, and a base coupled to the heat dissipation module, the base configured to connect an external power supply to the heat dissipation module;
   a light source; and
   a driver module (i) having a top end coupled to the light source and a bottom end coupled to the base (ii) being at least partially disposed within the interior chamber, and (iii) configured to regulate current provided to the light source;
   wherein the heat dissipation module comprises a mounting module having at least two mounting slots configured to receive a mounting portion of the driver module, the driver module comprising a spring having one end being coupled to the heat dissipation module via a portion of the interior chamber of the lamp shell located above the base and a second end coupled to the top end of the driver module; and
   wherein the receiving of the mounting portion of the driver into the mounting slots and the coupling of the spring to the heat dissipation module fastens the driver module to the lamp shell, the fastening facilitating an electrical connection between the driver module and the heat dissipation module of the lamp shell.

2. The lamp according to claim 1, wherein one end of the driver module is coated with solder and is interference fitting with the mounting slots to achieve the electrical connection between the driver module and the heat dissipation module.

3. The lamp according to claim 1, wherein the driver module comprises a spring coupled to a boss of the heat dissipation module, for electrically connecting the driver module to the heat dissipation module.

4. The lamp according to claim 1, wherein the base comprises a cap and a pin module mounted on the cap, and the pin module comprises an insulating support plate and at least one pin, wherein the at least one pin is electrically connected to the external power supply.

5. The lamp according to claim 4, wherein the cap and the heat dissipation module are integrally formed.

6. The lamp according to claim 1, wherein the base comprises an insulating portion and a thread portion extending outward from at least a part of an outer surface of the insulating portion, the thread portion configured to connect with the external power supply, the insulating portion coupled to the heat dissipation module.

7. The lamp according to claim 1, wherein the heat dissipation module is made of a thermal conductive material that provides EMI shielding, and wherein the lamp shell further comprises an insulating shell covering at least a part of an outer surface of the heat dissipation module, the insulating shell made of a material selected from poly (vinyl chloride) alloy, polycarbonate, polymethyl methacrylate, polyvinyl chloride, polystyrene, polyethylene and combinations thereof.

8. The lamp according to claim 1, wherein the lamp comprises a reflector-type lamp, and the light source comprises at least one of a light emitting diode light source and a gas-discharge light source.

9. The lamp according to claim 1, wherein the driver module comprises a power ground end electrically connected to the heat dissipation module.

10. The lamp according to claim 9, further comprising a capacitance coupled between the power ground end and the heat dissipation module.

11. The lamp according to claim 1, further comprising a lens coupled to the lamp shell, wherein the interior chamber is defined between the lens and the lamp shell.

* * * * *